(12) United States Patent
Gawron et al.

(10) Patent No.: US 9,179,536 B2
(45) Date of Patent: Nov. 3, 2015

(54) PRINTED CIRCUIT BOARD ASSEMBLY AND SOLDER VALIDATION METHOD

(71) Applicant: Lear Corporation, Southfield, MI (US)

(72) Inventors: Steven F. Gawron, Plymouth, MI (US); Jonathan Dahlstrom, Highland, MI (US)

(73) Assignee: Lear Corporation, Southfield, MI (US)

( * ) Notice: Subject to any disclaimer, the term of this patent is extended or adjusted under 35 U.S.C. 154(b) by 151 days.

(21) Appl. No.: 13/766,237

(22) Filed: Feb. 13, 2013

(65) Prior Publication Data

US 2013/0322041 A1 Dec. 5, 2013

Related U.S. Application Data

(60) Provisional application No. 61/652,907, filed on May 30, 2012.

(51) Int. Cl.
| | |
|---|---|
| *H05K 3/00* | (2006.01) |
| *H05K 1/02* | (2006.01) |
| *H05K 1/18* | (2006.01) |
| *H05K 3/06* | (2006.01) |

(52) U.S. Cl.
CPC .............. *H05K 1/0213* (2013.01); *H05K 1/184* (2013.01); *H05K 3/00* (2013.01); *H05K 3/06* (2013.01); *H05K 2201/10303* (2013.01); *Y10T 29/4913* (2015.01)

(58) Field of Classification Search
CPC .......... H05K 2201/10689; H05K 2201/09236; H05K 2201/0949; H05K 1/111; H05K 1/112
USPC .................. 361/760, 761, 762, 767, 777, 803
See application file for complete search history.

(56) References Cited

U.S. PATENT DOCUMENTS

| | | | | |
|---|---|---|---|---|
| 3,567,844 | A * | 3/1971 | Krcmar | 174/268 |
| 4,090,655 | A * | 5/1978 | Tissot | 228/103 |
| 4,522,449 | A * | 6/1985 | Hayward | 361/775 |
| 4,877,176 | A | 10/1989 | Kubis | |
| 5,092,035 | A | 3/1992 | McMichen et al. | |
| 5,106,310 | A | 4/1992 | Krajewski et al. | |
| 5,140,745 | A | 8/1992 | McKenzie, Jr. | |
| 5,481,436 | A * | 1/1996 | Werther | 361/784 |
| 5,637,835 | A * | 6/1997 | Matern | 174/266 |
| 6,181,551 | B1 * | 1/2001 | Herman et al. | 361/679.6 |
| 7,377,823 | B2 * | 5/2008 | Chen | 439/751 |
| 7,837,481 | B1 | 11/2010 | Mahoney et al. | |
| 8,294,035 | B2 * | 10/2012 | Chou et al. | 174/257 |
| 2006/0166526 | A1 | 7/2006 | Lee et al. | |
| 2011/0017505 | A1 | 1/2011 | Hardin et al. | |

* cited by examiner

Primary Examiner — Timothy Thompson
Assistant Examiner — Michael F McAllister
(74) Attorney, Agent, or Firm — Brooks Kushman P.C.

(57) ABSTRACT

A solder validation method for a printed circuit board (PCB) having a pin hole extending through the PCB, an electrically conductive trace on a surface of the PCB, and an electrically conductive pin inserted through the pin hole includes the following. An electrically non-conductive portion is provided on the surface of the PCB between the pin hole and the trace such that the non-conductive portion electrically isolates the pin from the trace. After a soldering process intended to solder the pin and the trace together, a soldered connection between the pin and the trace is detected as being absent when no electrical continuity is between the pin and the trace as a soldered connection between the pin and the trace has to be present to provide the electrical continuity due to the pin and the trace otherwise being electrically isolated from one another by the non-conductive portion.

2 Claims, 4 Drawing Sheets

PRINTED CIRCUIT BOARD ASSEMBLY AND SOLDER VALIDATION METHOD

CROSS-REFERENCE TO RELATED APPLICATIONS

This application claims the benefit of U.S. Provisional Application No. 61/652,907, filed May 30, 2012, the disclosure of which is incorporated in its entirety by reference herein.

TECHNICAL FIELD

The present invention relates to soldering processes for printed circuit boards.

BACKGROUND

A printed circuit board assembly includes a printed circuit board (PCB) and electronic components mounted thereon. The PCB mechanically supports the electronic components and electrically connects the components with electrically conductive traces.

SUMMARY

An object of the present invention includes a printed circuit board (PCB) having a pin hole extending through the PCB, an electrically conductive trace on a surface of the PCB, and an electrically non-conductive ring on the surface of the PCB positioned between the pin hole and the conductive trace such that the non-conductive ring physically separates a long pin inserted through the pin hole from the conductive trace on the surface of the PCB.

Another object of the present invention includes a method for use with the PCB in which the method includes detecting, after a soldering process intended to solder the long pin and the conductive trace together, that a soldered connection between the long pin and the conductive trace is absent when no electrical continuity is between the long pin and the conductive trace as a soldered connection between the long pin and the conductive trace has to be present to provide the electrical continuity due to the long pin and the conductive trace otherwise being physically separated (i.e., electrically isolated) from one another by the non-conductive ring.

In carrying out at least one of the above and other objects, the present invention provides an assembly having a printed circuit board (PCB). The PCB has a pin hole extending through the PCB, an electrically conductive trace on a surface of the PCB, and an electrically non-conductive portion on the surface of the PCB. The assembly further includes an electrically conductive pin. The pin is inserted through the pin hole. The non-conductive portion is positioned between the pin hole and the trace such that the non-conductive portion physically separates (i.e., electrically isolates) the pin from the trace on the surface of the PCB.

The pin and the trace may be electrically connected together with a soldered connection. The pin and the trace otherwise lack an electrical continuity between one another due to being physically separated from one another by the non-conductive portion.

Further, in carrying out at least one of the above and other objects, the present invention provides a method for a PCB having a pin hole extending through the PCB, an electrically conductive trace on a surface of the PCB, and an electrically conductive pin inserted through the pin hole. The method includes providing an electrically non-conductive portion on the surface of the PCB between the pin hole and the trace such that the non-conductive portion electrically isolates the pin from the trace on the surface of the PCB. The method further includes detecting after a soldering process intended to provide a soldered connection between the pin and the trace that a soldered connection between the pin and the trace is absent when electrical continuity is absent between the pin and the trace as a soldered connection between the pin and the trace has to be present to provide the electrical continuity due to the pin and the trace otherwise being physically separated from one another by the non-conductive portion.

The method may further include detecting after the soldering process that a soldered connection between the pin and the trace is present when electrical continuity is present between the pin and the conductive trace.

In accordance with embodiments of the present invention, in order to validate an edge solder process, an electrically non-conductive ring is respectively added around each of one or more of the long pins that join the upper and lower printed circuit boards of a PCB assembly together. In particular, a non-conductive ring is respectively added around each of one or more pin holes extending through the printed circuit boards for the corresponding long pins. That is, on each edge of the PCB assembly that requires soldering, one or more long pins thereof respectively have a non-conductive ring associated therewith. The non-conductive ring is positioned on a surface of one of the printed circuit boards and is further positioned between the corresponding long pin and an electrical conductive trace on the surface of the one of the printed circuit boards. The non-conductive ring creates an open circuit during the end-of-line electrical test when the soldering process is not completed properly between the long pin and the corresponding electrical trace. The non-conductive ring around a long pin is new as typically the long pin makes intersecting contact with the corresponding electrical trace (as opposed to being separated by the non-conductive ring from the trace) when the long pin is inserted through the printed circuit board.

The above features, and other features and advantages of the present invention are readily apparent from the following detailed description thereof when taken in connection with the accompanying drawings. It is understood that the features stated above and to be explained below may be used not only in the particular stated combination, but also in other combinations or alone without departing from the scope of the present invention.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
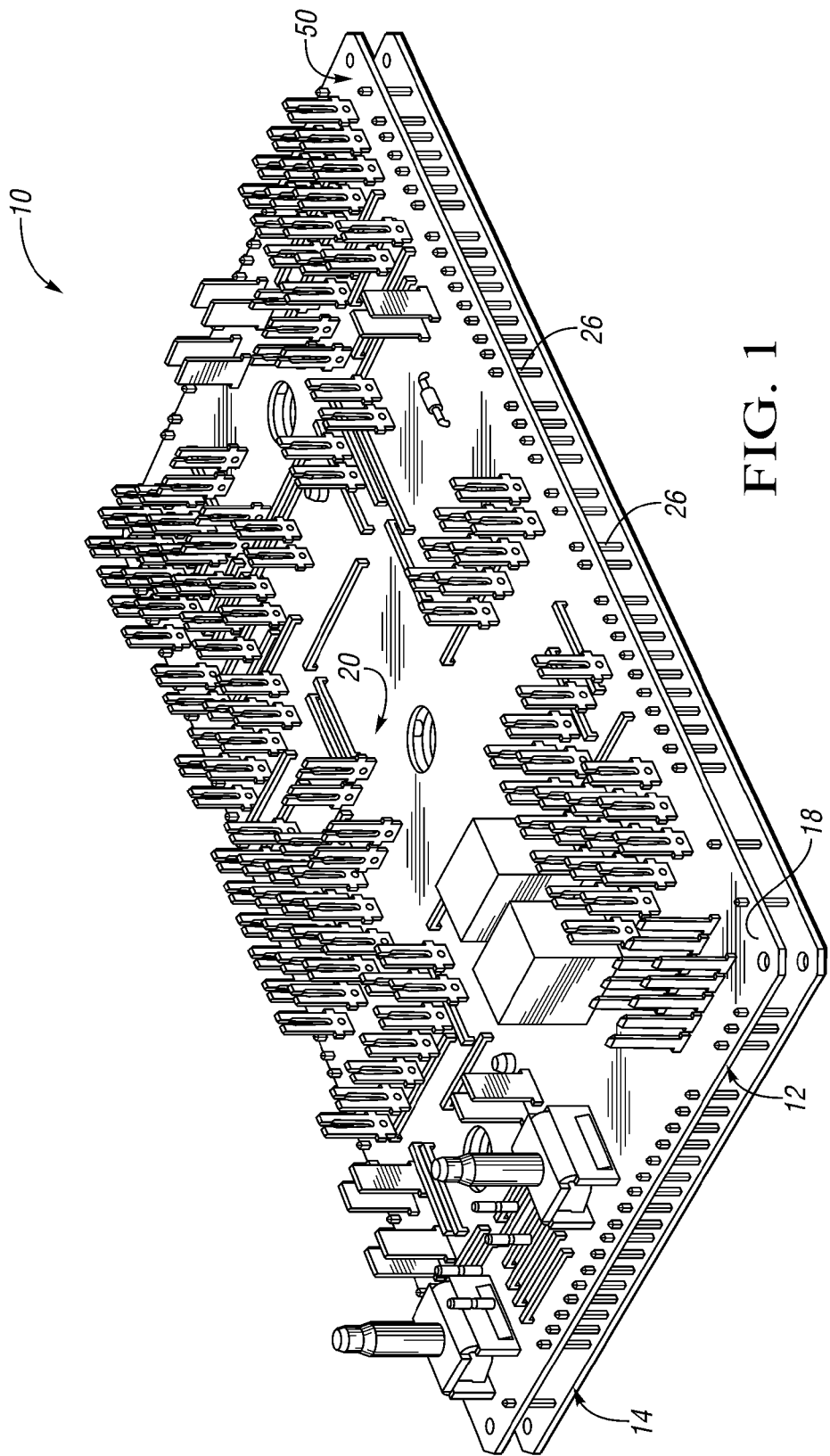
FIG. 1 illustrates a perspective view of an assembled printed circuit board (PCB) assembly having a top board and a bottom board with an insulator plate interposed therebetween in accordance with an embodiment of the present invention.
Figure 2:
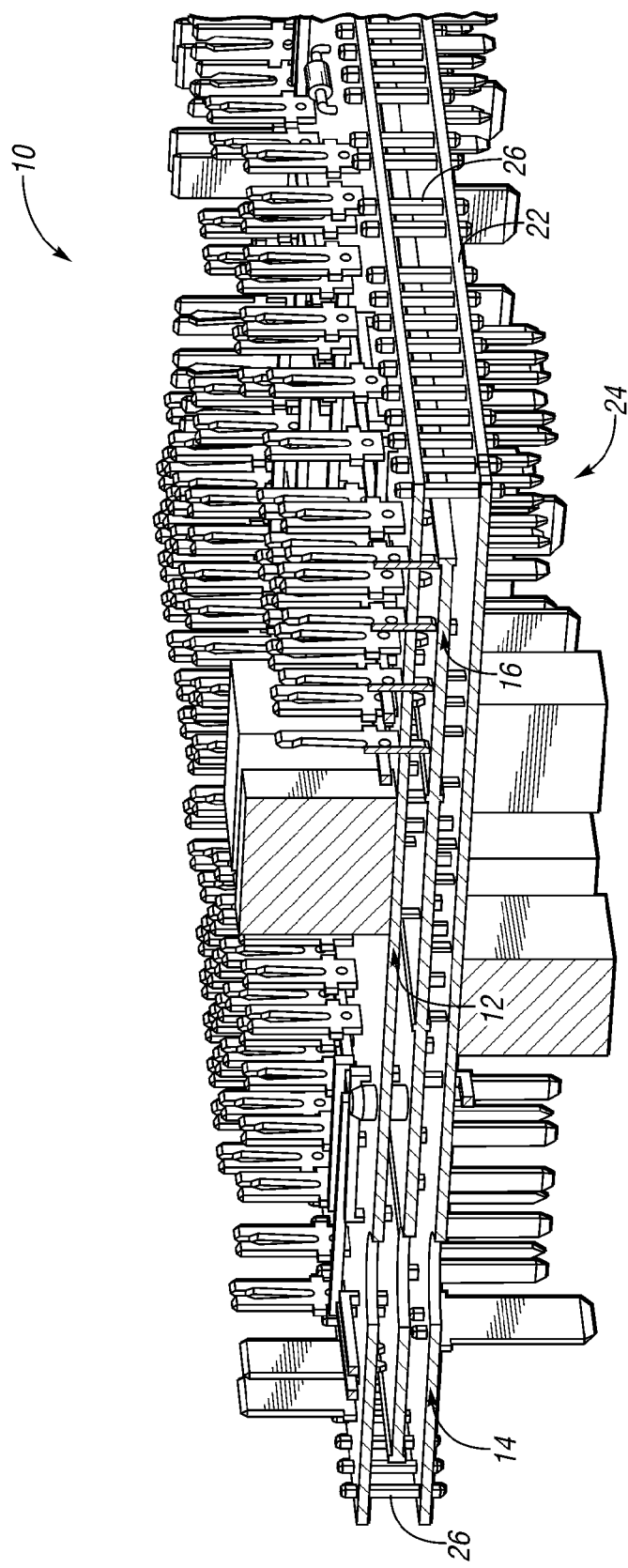
FIG. 2 illustrates a section view of the PCB assembly shown in FIG. 1.

Referring now to FIGS. 1 and 2, perspective and section views of a final stitched assembled printed circuit board (PCB) assembly 10 in accordance with an embodiment of the present invention are respectively shown. PCB assembly 10 includes two PCBs 12 and 14. Top PCB 12 (or top board 12) and bottom PCB 14 (or bottom board 14) are physically spaced apart from one another and stacked on top one another when PCB assembly 10 is assembled. PCB assembly 10 further includes an electrical insulator plate 16 or the like between top and bottom boards 12 and 14. Boards 12, 14 with insulator plate 16 interposed therebetween form a type of sandwich in the assembled PCB assembly 10.

Top board 12 mechanically supports electronic components mounted thereon and electrically connects these components using electrically conductive traces and the like. In particular, the top surface 18 of top board 12 includes a given pattern of conductive traces 19 (labeled in FIG. 3) for electrically connecting electronic components (generally indicated by reference numeral 20) mounted on the top surface 18 of top board 12. Such electronic components include electronic chips, male and female electrical connectors for mechanically and electrically connecting with external components, etc.

Similarly, bottom board 14 mechanically supports electronic components mounted thereon and electrically connects these components using electrically conductive traces and the like. In particular, the bottom surface 22 of bottom board 14 includes a given pattern of conductive traces 23 (labeled in FIG. 3) for electrically connecting electronic components (generally indicated by reference numeral 24) mounted on the bottom surface 22 of bottom board 14.

Conductive traces 19, 23 are electrically conductive traces which are "printed" on the corresponding surfaces 18, 22 of boards 12, 14. Boards 12, 14 including the areas of surfaces 18, 22 not covered with conductive traces 19, 23 are non-electrically conductive. As such, top surface 18 of top board 12, other than the portions of top surface 18 covered with conductive traces 19, is electrically non-conductive. Likewise, bottom surface 22 of bottom board 14, other than the portions of bottom surface 22 covered with conductive traces 23, is electrically non-conductive.

Figure 3:
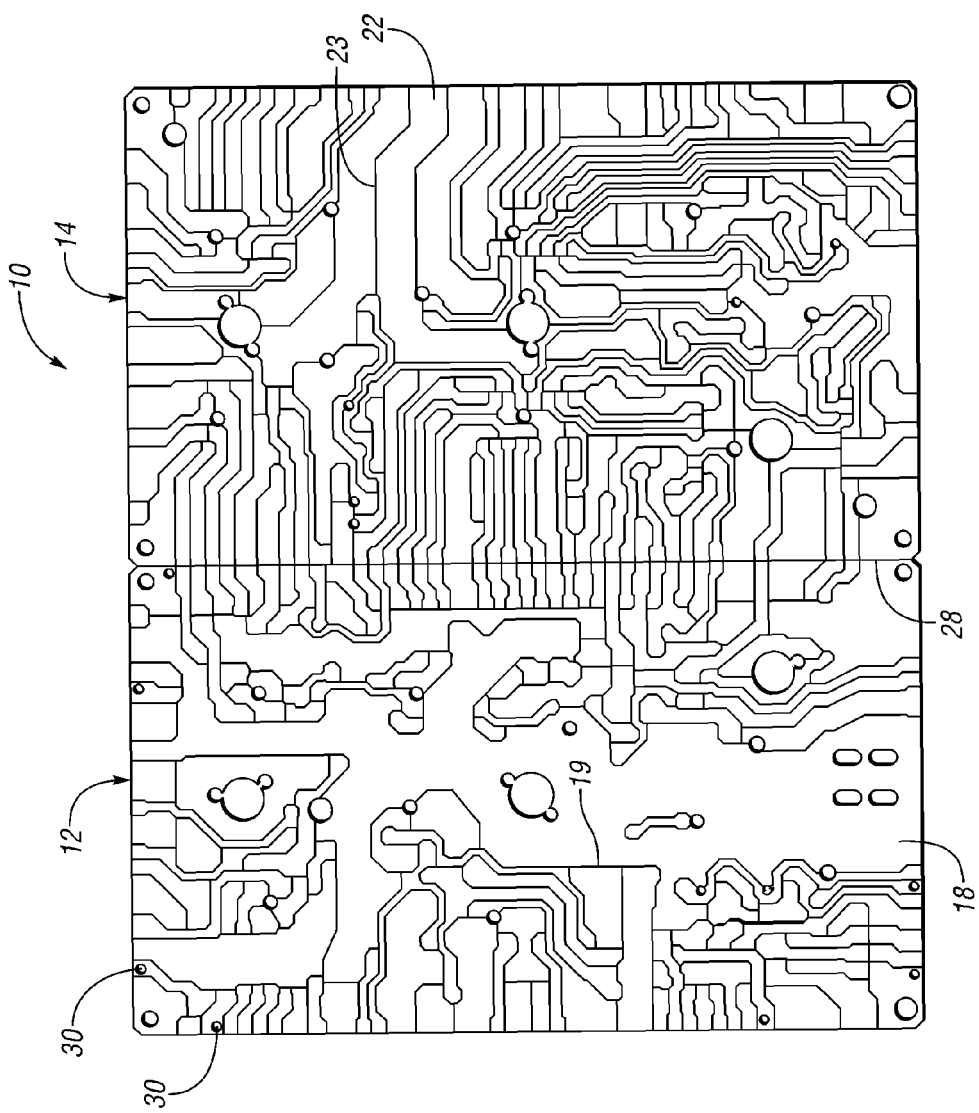
FIG. 3 illustrates a schematic view of the top surface of the top board and the bottom surface of the bottom board of the PCB assembly shown in FIG. 1 with the boards being part of a unitary board prior to being broken apart from one another to form the PCB assembly.

FIG. 3 illustrates a schematic view of top surface 18 of top board 12 and bottom surface 22 of bottom board 14. Boards 12, 14 are shown in FIG. 3 as being a part of unitary board. A perforation 28 or the like runs between boards 12, 14. Boards 12, 14 are torn apart from one another along perforation 28. Separated boards 12, 14 are then stacked on top one another, spaced-apart, with top surface 18 of top board 12 facing one direction and bottom surface 22 of bottom board 14 facing the opposite direction to assemble PCB assembly 10. During this process, insulator plate 16 is positioned between boards 12, 14 such that insulator plate 16 faces the bottom surface of top board 12 and the top surface of bottom board 14 in order to assemble PCB assembly 10.

As shown in FIG. 2, insulator plate 16 is mechanically connected between the bottom surface of top board 12 and the top surface of bottom board 14. Insulator plate 16 has a smaller surface area than boards 12, 14. Insulator plate 16 is positioned between boards 12, 14 such that the edges of boards 12, 14 on one or more sides of boards 12, 14 laterally extend beyond insulator plate 16. As such, the edges of boards 12, 14 are separated from one another by an empty space instead of being separated from one another by insulator plate 16.

PCB assembly 10 further includes a plurality of electrically conductive long pins 26. Long pins 26 enable electrical connections between boards 12, 14 and the electrical components thereof. As such, long pins 26 enable electrical current to be transferred between boards 12, 14 and the electrical components. Long pins 26 physically extend between boards 12, 14 and are mechanically connected at one end to top board 12 and at the opposite end to bottom board 14. In particular, the top ends of long pins 26 extend above top surface 18 of top board 12 and the bottom ends of long pins 26 extend below bottom surface 22 of bottom board 14.

Both boards 12, 14 include vias (e.g., pin holes) for accommodating long pins 26. The pin holes, labeled with reference numeral 30, are drilled or bored through each board 12, 14 such that the pin holes extend through the entire cross-section of the boards. The pin holes are placed alongside the edges of boards 12, 14 which extend beyond insulator plate 16. The pin holes are aligned with one another when boards 12, 14 are stacked in the sandwich formation. Long pins 26 are inserted into and through respective ones of pin holes 30 such that long pins 26 extend through and between boards 12, 14. As the pin holes are alongside the edges of boards 12, 14 which extend past insulator plate 16, long pins 26 (i.e., "edge" pins 26) extend between boards 12, 14 around insulator plate 16 without intersecting with insulator plate 16 (seen in FIG. 2).

At least some of long pins 26 are to be electrically connected to certain conductive traces 19 on top surface 18 of top board 12 and to certain conductive traces 23 on bottom surface 22 of bottom board 14 in order to electrically connect these traces. This enables an electrical connection between electronic components on top surface 18 of top board 12, which are electrically connected to the certain conductive traces 19, and electronic components on bottom surface 22 of bottom board 14, which are electrically connected to the certain conductive traces 23.

For example, a given long pin 26 is to electrically connect a given conductive trace 19 on top surface 18 of top board 12 and a given conductive trace 23 on bottom surface 22 of bottom board 14. Long pin 26 electrically connects these conductive traces 19, 23 when long pin 26 is electrically connected to both traces 19, 23. That is, long pin 26 electrically connects these conductive traces 19, 23 together when top board trace 19 is electrically connected to the top end of long pin 26 (which extends above top surface 18 of top board 12) and bottom board trace 23 is electrically connected to the bottom end of long pin 26 (which extends below bottom surface 22 of bottom board 14).

During a typical assembly process, a corresponding pair of pin holes 30 for given long pin 26 which is to electrically connect given conductive traces 19, 23 is formed through boards 12, 14. One pin hole 30 is formed through top board 12 adjacent to a portion of given trace 19 on top surface 18 of top board 12. The corresponding other pin hole is formed through bottom board 14 adjacent to a portion of given trace 23 on bottom surface 22 of bottom board 14. Long pin 26 is inserted through the aligned pin holes such that the top end of long pin 26 extends above top surface 18 of top board 12 and the bottom end of long pin 26 extends below bottom surface 22 of bottom board 14. Subsequently, the top end of long pin 26 and the adjacent portion of trace 19 on top surface 18 of top board 12 are soldered together to thereby electrically connect long pin 26 and trace 19. Likewise, the bottom end of long pin 26 and the adjacent portion of trace 23 on bottom surface 22 of bottom board 14 are soldered together to thereby electrically connect long pin 26 and trace 23. Consequently, traces 19, 23 are electrically connected together via long pin 26.

A problem occurs when an end of a long pin 26 is not soldered properly to the corresponding trace portion and the long pin and the corresponding trace portion are not otherwise electrically connected together. For example, it is problematic when the top end of long pin 26 is not soldered properly to the corresponding portion of a trace 19 on top surface 18 of top board 12. It is a problem as trace 19 and trace 23, which is on bottom surface 22 of bottom board 14 and is presumably properly electrically connected to the bottom end of long pin 26, will not be electrically connected to one another via long pin 26 because long pin 26 and trace 19 in this example are not electrically connected.

However, the problem of concern in this disclosure is not that there is no electrical connectivity between long pin 26 and trace 19 (although this is also a problem to be dealt with separately). Rather, the problem of concern in this disclosure occurs when the following conditions are met: (i) relatively small areas of an end of long pin 26 physically touch or intersect the corresponding portion of a trace; and (ii) the end of long pin 26 and the corresponding trace portion are not soldered properly. More particularly, the problem of concern occurs when (i) relatively small areas of the end of long pin 26 physically touch or intersect the corresponding trace portion prior to a soldering process intended to solder the end of long pin 26 and the corresponding trace portion together and (ii) a soldered connection between the end of long pin 26 and the corresponding trace portion is absent after the soldering process, for instance due to long pin 26 and the corresponding trace portion not being soldered together properly.

Figure 4:
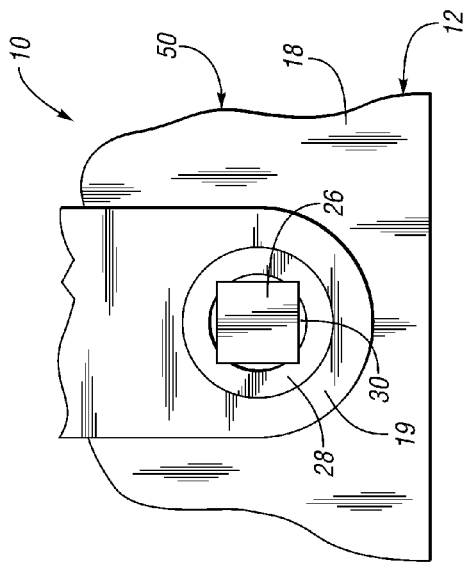
FIG. 4 illustrates an overhead view of a portion of the top board in a typical PCB assembly in which the top board portion has a long pin and a conductive trace portion adjacent to an end of the long pin.

Referring now to FIG. 4, an overhead view of a portion 40 of top board 112 in a typical PCB assembly 100 is shown. Top board portion 40 of typical PCB assembly 100 has a long pin 126 and a conductive trace portion 119. Trace portion 119 is on top surface 118 of top board 112 and is adjacent to the top end of long pin 126 as shown in FIG. 4. As further shown in FIG. 4, one or more corners of the top end of long pin 126 physically touches or intersect trace portion 119 as indicated at reference numeral 127. The physical intersection between a corner of long pin 126 and trace portion 119 occurs upon long pin 126 being inserted through corresponding pin hole 30 of top board portion 40. As such, the intersected areas occur prior to a subsequent soldering process for soldering long pin 126 and trace portion 119 together.

The relatively small intersection(s) between the top end of long pin 126 and the corresponding trace portion 119 causes an intermittent electrical continuity between long pin 126 and trace 119. As a result, the electrical connection between trace 119 and a conductive trace on the bottom board via long pin 126 is intermittent and thereby is not reliable and can be lost over time. However, as the continuity is intermittent, it may be initially detected during assembly of typical PCB assembly 100 that all is well even when the top end of long pin 126 and trace portion 119 are not soldered together. For instance, the end of long pin 126 and trace portion 119 may not be soldered together after the soldering process is conducted due to the soldering process not being done properly. Subsequently, once typical PCB assembly 100 is incorporated into an end product such as a vehicle, the continuity can become lost and the electrical connection will be gone as the top end of long pin 126 and trace portion 119 are not soldered together. This is likely to be an extremely undesired outcome.

Thus, it is desired to provide a soldered connection between the top end of long pin 26 and the corresponding portion of trace 19 during the assembly of PCB assembly 10 or at least detect, during the assembly of PCB assembly 10, when a soldered connection between the top end of long pin 26 and the corresponding portion of trace 19 is absent.

Figure 5:
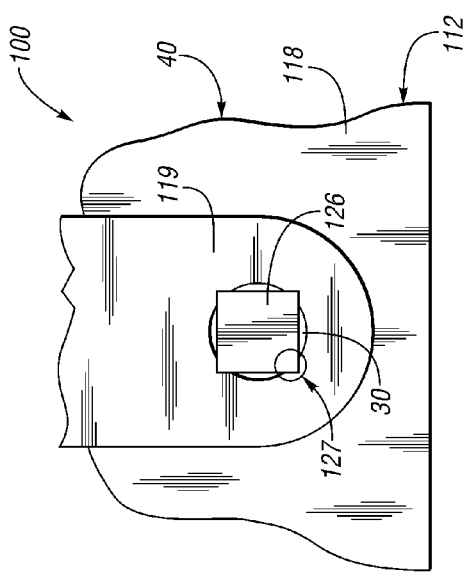
FIG. 5 illustrates an overhead view of a portion of the top board of the PCB assembly shown in FIG. 1 in which the top board portion has a long pin and a conductive trace portion adjacent to an end of the long pin.
Figure 6:
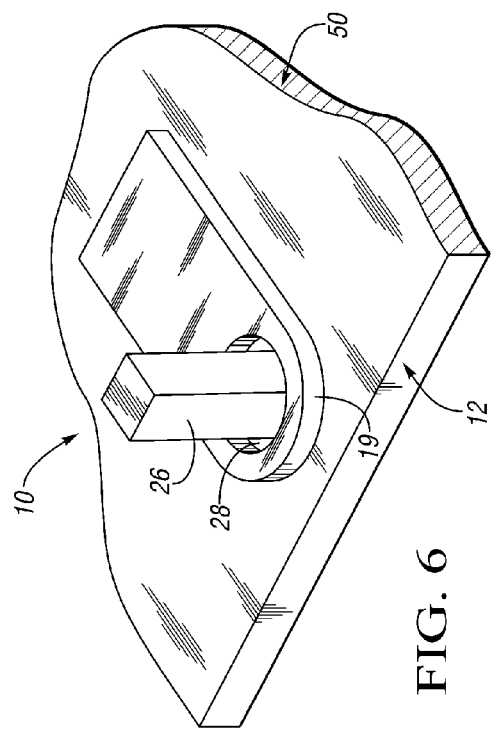
FIG. 6 illustrates an angled overhead view of the top board portion of the PCB assembly as shown in FIG. 5.

Referring now to FIGS. 5 and 6, overhead and angled overhead views of a portion 50 of top board 12 of PCB assembly 10 are respectively shown. Top board portion 50 has a long pin 26 and a conductive trace portion 19. Trace portion 19 is on top surface 18 of top board 12 and is adjacent to the top end of long pin 26. Notably, trace portion 19 is circumferentially offset from the top end of long pin 26 such that long pin 26 does not physically intersect anywhere with trace portion 19. Accordingly, unlike top board portion 40 of typical PCB assembly 100 shown in FIG. 4, none of the corners of long pin 26 physically intersect trace portion 19. Rather, in top board portion 50 of PCB assembly 10, the top end of long pin 26 and trace portion 19 are separated by an electrically non-conductive ring 28.

Non-conductive ring 28 is formed from the area of top surface 18 of top board 12 which surrounds the top end of long pin 26 on top surface 18 and physically separates (i.e., electrically isolates) the top end of long pin 26 from trace portion 19. Non-conductive ring 28 is the portion of top board 12 which immediately surrounds pin hole 30 through which long pin 26 extends and has not been "printed" with conductive trace material. As noted above, the surfaces of both boards 12, 14 are non-conductive with the exception of conductor traces 19, 23. Thus, non-conductive ring 28 is non-conductive as conductive trace material is not provided in this area between pin hole 30 through which long pin 26 extends and trace portion 19 adjacent to the top end of long pin 26.

Thus, as there is no physical intersection between long pin 26 and trace portion 19 due to the presence of non-conductive ring 28 there is no electrical continuity (intermittent or otherwise) between long pin 26 and trace portion 19 unless long pin 26 and trace portion 19 are soldered together. Therefore, it may be detected that all is not well during the assembly of PCB assembly due to the lack of electrically continuity between long pin 26 and trace portion 19 in the event that long pin 26 and trace portion 19 are not soldered together. Thus, it can be detected during assembly of PCB assembly 10 that long pin 26 and trace portion 19 are not soldered together and corrective actions such as soldering long pin 26 and trace portion 19 can be taken.

Non-conductive ring 28 can be formed when the conductor traces and pin holes 30 for long pins 26 are being formed. The process for laying down conductor traces 19, 23 on the surface of a board is modified such that non-conductive ring 28 is maintained between a given pin hole and the adjacent portion of the corresponding trace.

Non-conductive rings 28 can be created respectively around selected pin holes 30 for long pins 26 on each surface of boards 12, 14. If edge solder is missing between the long pin and a corresponding trace portion, then the circuit will not exhibit continuity and will not pass an end-of-line test process. During the assembly process of PCB assembly 10, each non-conductive ring 28 is filled with solder when PCB assembly 10 passes through the solder process. Therefore, the endof-line tester will verify that PCB assembly 10 was soldered properly. If non-conducive ring 28 is not soldered, then the end-of-line tester will detect the open circuit and identify the failure.

Advantages of electrically non-conductive ring 28 may include that such ring does not inhibit soldering of edge pins and that solder fill is complete and without gaps. In general, the use of non-conductive ring 28 enables detection of a non-soldered connection and does not prevent a proper solder joint.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method for a printed circuit board (PCB) having a pin hole extending through the PCB, the method comprising:
   providing an electrically non-conductive ring entirely around the pin hole, the non-conductive ring being a portion of the PCB;
   providing an electrically conductive trace, lacking a solder coating thereon, on a surface of the PCB, the trace having a trace ring entirely around the non-conductive ring with the non-conductive ring being between the pin hole and the trace ring such that the non-conductive ring electrically isolates the pin hole from the trace ring;
   inserting an electrically conductive pin, having a rectangular cross-section, through the pin hole with corners of the pin physically intersecting corresponding portions of the non-conductive ring immediately adjacent to the pin hole, the pin and the trace ring being electrically isolated from one another by the non-conductive portion;
   after the pin is inserted through the pin hole, performing a soldering process intended to provide a soldered connection between the pin and the trace ring, wherein a soldered connection between the pin and the trace ring is present when the soldering process is successful, wherein a soldered connection between the pin and the trace ring is absent when the soldering process is unsuccessful; and
   detecting after the step of performing the soldering process intended to provide a soldered connection between the pin and the trace ring that a soldered connection between the pin and the trace ring is absent when electrical continuity is absent between the pin and the trace ring as a soldered connection between the pin and the trace ring has to be present to provide the electrical continuity between the pin and the trace ring due to the pin and the trace ring otherwise being physically separated and electrically isolated from one another by the non-conductive portion.

2. A method for a printed circuit board (PCB) assembly having a first PCB and a second PCB, the first PCB having a first pin hole extending through the first PCB and the second PCB having a second pin hole extending through the second PCB, the PCBs being stacked over one another with the pin holes being aligned, the method comprising:
   providing a first electrically non-conductive ring entirely around the first pin hole, the first non-conductive ring being a portion of the first PCB;
   providing a second electrically non-conductive ring entirely around the second pin hole, the second non-conductive ring being a portion of the second PCB;
   providing a first electrically conductive trace, lacking a solder coating thereon, on a surface of the first PCB, the first trace having a first trace ring entirely around the first non-conductive ring with the first non-conductive ring being between the first pin hole and the first trace ring such that the first non-conductive ring electrically isolates the first pin hole from the first trace ring;
   providing a second electrically conductive trace, lacking a solder coating thereon, on a surface of the second PCB, the second trace having a second trace ring entirely around the second non-conductive ring with the second non-conductive ring being between the second pin hole and the second trace ring such that the second non-conductive ring electrically isolates the second pin hole from the second trace ring;
   inserting an electrically conductive pin, having a rectangular cross-section, through the pin holes with corners of the pin physically intersecting corresponding portions of the first non-conductive ring immediately adjacent to the first pin hole and the second non-conductive ring immediately adjacent to the second pin hole, the pin and the first trace ring being electrically isolated from one another by the first non-conductive portion and the pin and the second trace ring being electrically isolated from one another by the second non-conductive portion;
   after the pin is inserted through the pin holes, performing a soldering process intended to provide a soldered connection between the pin and the first trace ring and a soldered connection between the pin and the second trace ring, wherein a soldering connection is present between the pin and the first trace ring and a soldering connection is present between the pin and the second trace ring when the soldering process is successful, wherein a soldering connection is absent between the pin and at least one of the first trace ring and the second trace ring when the soldering process is unsuccessful; and
   detecting after the step of performing the soldering process intended to provide a soldered connection between the pin and the first trace ring and a soldered connection between the pin and the second trace ring that a soldered connection between the pin and at least one of the trace rings is absent when electrical continuity is absent between the trace rings as a soldered connection between the pin and the first trace ring and a soldered connection between the pin and the second trace ring have to be present to provide the electrical continuity between the trace rings due to at least one of the trace rings otherwise being electrically isolated from the pin by the corresponding non-conductive portion.

* * * * *